United States Patent [19]

Mimoto

[11] Patent Number: 4,651,030
[45] Date of Patent: Mar. 17, 1987

[54] DECODER CIRCUIT FOR MOS MEMORY OF A REDUNDANT STRUCTURE

[75] Inventor: Toshio Mimoto, Osaka, Japan

[73] Assignee: Sharp Kabushiki Kaisha, Osaka, Japan

[21] Appl. No.: 680,271

[22] Filed: Dec. 10, 1984

[30] Foreign Application Priority Data

Dec. 15, 1983 [JP] Japan .................................. 58-193436

[51] Int. Cl.⁴ .................. H03K 19/003; H03K 19/096
[52] U.S. Cl. .................................. 307/449; 307/200 B; 307/202.1; 307/441; 307/463; 307/468
[58] Field of Search .................. 307/200 B, 219, 441, 307/443, 446, 449, 453, 465, 468–469, 463, 577, 584, 202.1; 364/716

[56] References Cited

U.S. PATENT DOCUMENTS

| | | | |
|---|---|---|---|
| 4,051,388 | 9/1977 | Inukai | 307/449 X |
| 4,399,372 | 8/1983 | Tanimoto et al. | 307/449 X |
| 4,455,495 | 6/1984 | Masuhara et al. | 307/465 X |
| 4,546,455 | 10/1985 | Iwahashi et al. | 307/449 X |

OTHER PUBLICATIONS

Tolley et al., "72-K RAM Stands Up to Soft and Hard Errors", Electronics, Jun. 1982, pp. 147–151.
Sud et al., "Designing Static RAMs for Yield as Well as Speed", Electronics, Jul. 1981, pp. 121–126.

Primary Examiner—Stanley D. Miller
Assistant Examiner—D. R. Hudspeth
Attorney, Agent, or Firm—Flehr, Hohbach, Test, Albritton & Herbert

[57] ABSTRACT

A decoder circuit for MOS memory of a redundant structure having shorter delays in access time contains a programmable element in a redundant circuit rather than connected in series on the word line driving signal.

4 Claims, 7 Drawing Figures

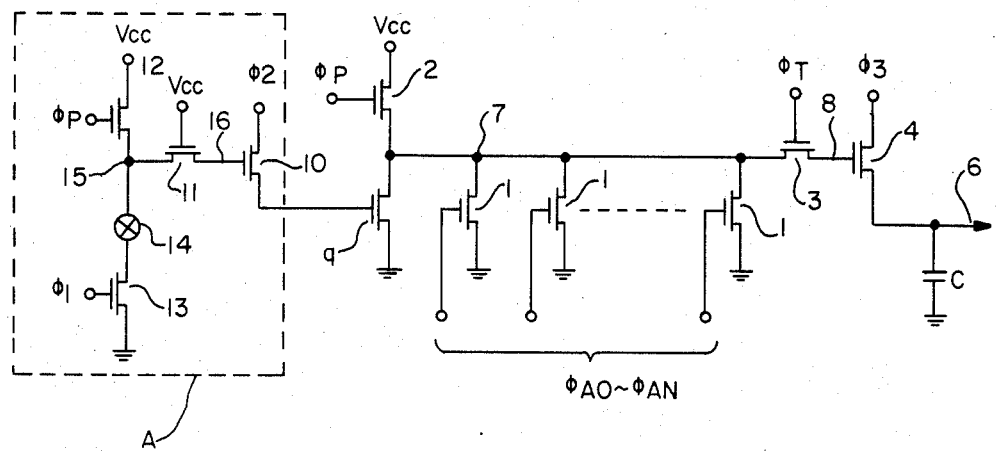
FIG.—1
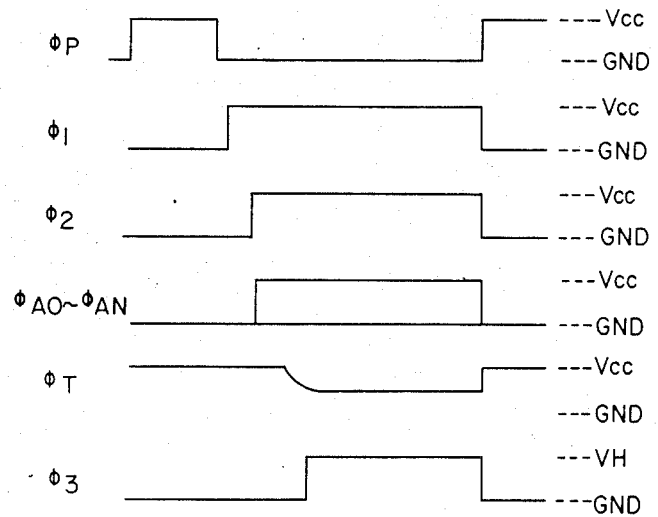
FIG.—2

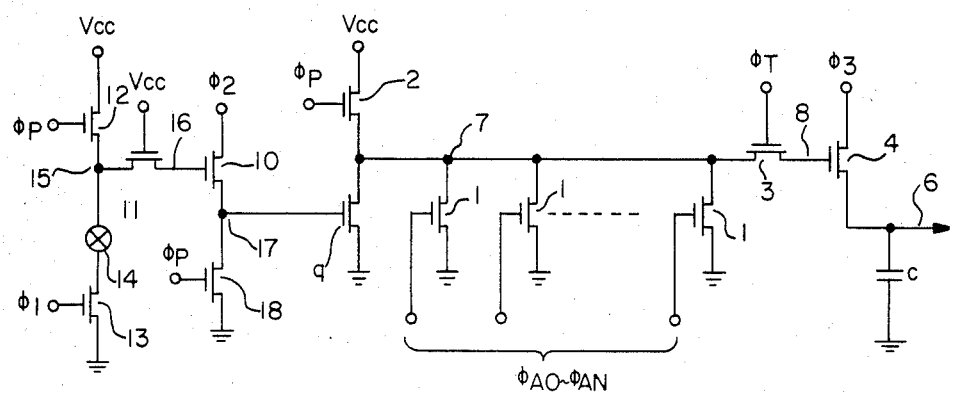
FIG.—3
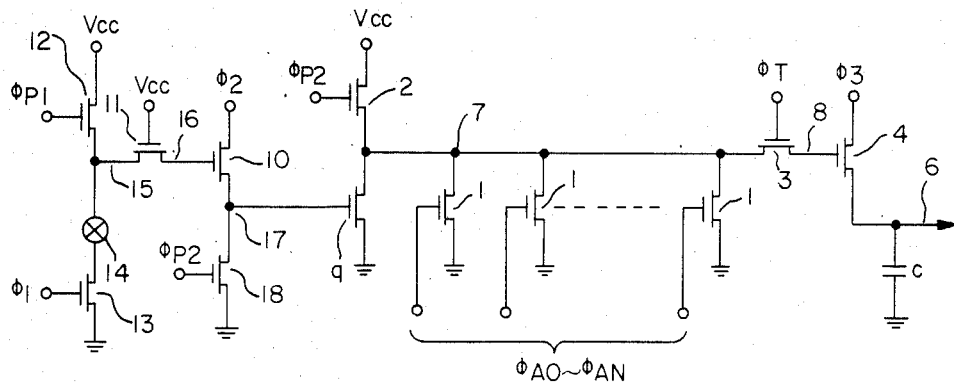
FIG.—4

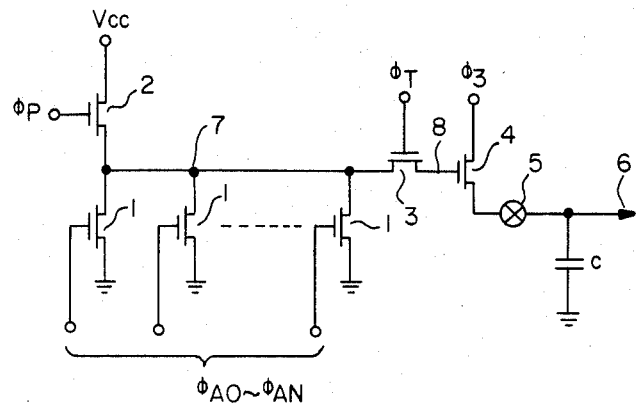
FIG. —6
PRIOR ART
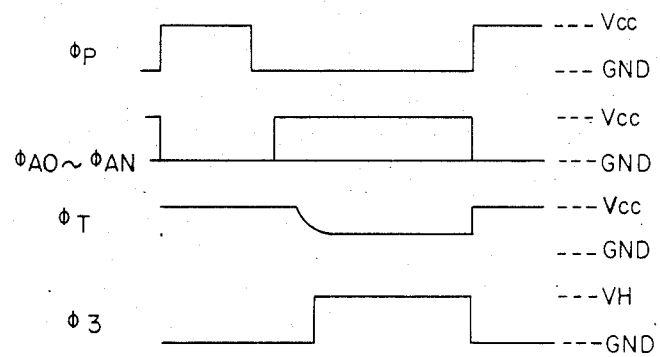
FIG. —7
PRIOR ART

DECODER CIRCUIT FOR MOS MEMORY OF A REDUNDANT STRUCTURE

BACKGROUND OF THE INVENTION

This invention relates to a decoder circuit for MOS memory of a redundant structure and in particular to such a decoder circuit intended for faster action.

A commonly used decoder circuit for MOS memory of a redundant structure is shown in FIG. 6, wherein No. 1 indicates MOS transistors for word line selection and address signals $\phi_{A0}$–$\phi_{AN}$ are connected to the individual gates, determining selection and deselection. A MOS transistor 2 for precharge is connected to the common drain of the MOS transistors 1 and a precharge signal $\phi_P$ is connected to the gate of the precharge MOS transistor 2. The gate of a MOS transistor 4 for driving the word line is also connected to the drain of the MOS transistors 1 through a transfer gate 3. A word line driving signal $\phi_3$ is connected to the drain of the MOS transistor 4 and the signal $\phi_3$ is transmitted to the word line 6 according to the control of the gate signal.

For the purpose of providing a decoder circuit suited for MOS memory of a redundant structure, there is inserted in the word line 6 an element 5 which is programmable by laser light or other external factors and is usually set in a transmissive condition. If a defect is detected in a memory cell connected to the word line 6, access to the defective memory cell can be prevented by shutting off the programmable element 5.

FIG. 7 is an action timing diagram of the decoder of FIG. 6, wherein $\phi_P$ is the precharge signal inputted at the gate of the precharge MOS transistor 2. During a precharge period, it precharges by the MOS transistor 2 both the node 7 which is the drain of the MOS transistors 1 and through the MOS transistor 3 the node 8 which is the gate of the word line driving MOS transistor 4. During an activation period, address signals $\phi_{A0}$–$\phi_{AN}$ are inputted for decoding and the nodes 7 and 8 of a deselected decoder circuit drop to ground potential, while the nodes 7 and 8 of a selected decoder circuit are maintained at high potentials. Next, the transfer signal $\phi_T$ drops and this sets the transfer gate 3 in an OFF position. Nodes 7 and 8 are thus cut off from each other and the driving signal $\phi_3$ is inputted to the MOS transistor 4 and is outputted on the word line 6 of the selected decoder circuit.

In conventional decoder circuits, since the floating capacity C of the word line is generally large, significant signal delays occur due to the resistance of the programmable element 5 made of polisilicon, etc. It is generally difficult to reduce the resistance of this programmable element 5 and this, according to the conventional design shown in FIG. 6, has been the cause of large delays in the access time of memory elements.

It is therefore an object of this invention to provide a decoder circuit for MOS memory of a redundant structure intended for faster action, and it is achieved by changing the position at which the programmable element is connected.

BRIEF DESCRIPTION OF THE DRAWINGS

FIG. 1 is a circuit diagram according to a first embodiment of the present invention. $V_{CC}$ represents power source.

FIG. 2 is a timing diagram of the circuit of FIG. 1.

FIG. 3 is a circuit diagram according to a second embodiment of the present invention.

FIG. 4 is a circuit diagram according to a third embodiment of the present invention.

FIG. 6 is a circuit diagram of a conventional MOS decoder circuit diagram of a redundant structure.

FIG. 7 is a timing diagram of the circuit of FIG. 6.

EMBODIMENTS OF THE INVENTION

Figure 5:
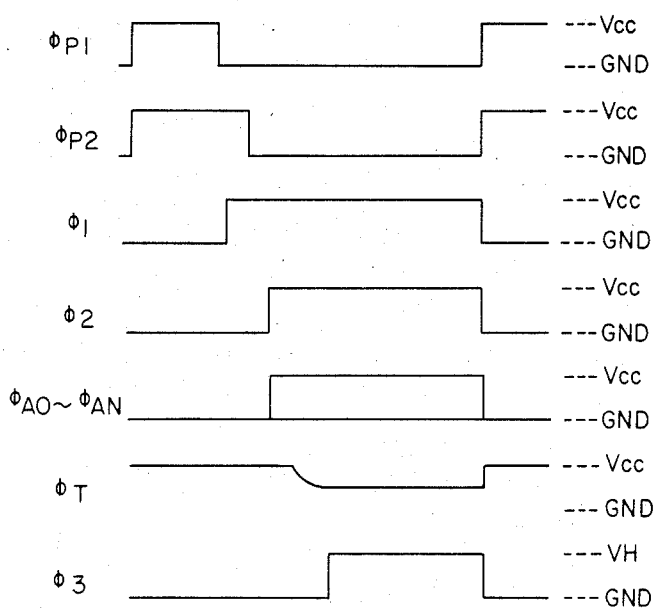
FIG. 5 is a timing diagram of the circuit of FIG. 4.

FIG. 1 shows a decoder circuit according to the present invention and its action timing diagram is shown in FIG. 2.

Regarding the address section, the structure of this decoder is identical to the conventional circuit described above so that address signals $\phi_{A0}$–$\phi_{AN}$ are connected to the MOS transistors 1 for decoding address signal and determination is made between selection and deselection. Connected to the node 7 which is the commonly connected drain of the decoding MOS transistors 1 are a precharge MOS transistor 2 and a transfer gate 3. A MOS transistor 4 for driving the word line is connected through this transfer gate 3 so that the word line driving signal $\phi_3$ is transmitted to the word line 6. Unlike the conventional circuit shown in FIG. 6, there is no programmable element connected to the word line 6. Instead, a MOS transistor 9 for maintaining voltage, of which the source is connected to ground potential, is attached to the precharge MOS transistor 2 so that the gate of this voltage maintaining MOS transistor 9 is controlled by the output from a control circuit A and it is in this control circuit A that a programmable element 14 is provided.

The control circuit A is constructed as described below so that the potential at the node 7 can be controlled by transmitting the information set in the programmable element 14 to the MOS transistor 9.

There is provided a driver MOS transistor 10 of which the source is connected to the gate of the MOS transistor 9, and of which the drain is connected to a second driving signal $\phi_2$ which its gate (node 16) is connected to the junction (node 15) between a second precharge MOS transistor 12 and the programmable element 14 through a transfer gate 11. The gate of the second precharge MOS transistor 12, like that of the aforementioned MOS transistor 2, is connected to the precharge signal $\phi_P$ for precharging the nodes 15 and 16 to high potentials during precharge period. The other end of the programmable element 14 is grounded through a MOS transistor 13, a first driving signal $\phi_1$ being applied to the gate thereof. The programmable element 14, as in the case of the conventional circuit described above, is generally set in a transmissive condition and is cut off only when there is a defective memory cell on the word line 6 to record the memory cell information fixedly.

When a decoder circuit of the structure described above enters an active period from a precharge period, the first driving signal $\phi_1$ is inputted to the gate of the MOS transistor 13 and, if the programmable element 14 is in a transmissive condition, the nodes 15 and 16 are discharged to ground potential. As a result, the driver MOS transistor 10 becomes cut off so that the MOS transistor 9 maintains its cut-off condition even if the second driving signal $\phi_2$ is subsequently inputted so that the action of this decoder will be in accordance with the combination of the address signals $\phi_{A0}$–$\phi_{AN}$. If the programmable element 14 was cut off, on the other hand, the nodes 15 and 16 will remain at high potentials even if the first driving signal $\phi_1$ is inputted. Accordingly, if the second driving signal $\phi_2$ is inputted, the gate of the MOS transistor 9 attains a high voltage through the driver MOS transistor 10. The nodes 7 and 8 go down to ground potential regardless of the conditions of the address signals $\phi_{A0}-\phi_{AN}$, and the word line 6 always becomes deselected. In other words, since a potential corresponding to the condition of the programmable element 14 (transmissive or not) is transmitted to the node 7 while there is hardly any cause for a delay on the side of the word line 6, the driving signal $\phi_3$ is quickly transmitted to the word line 6 through the MOS transistor 4.

FIG. 3 is a second embodiment of the present invention, representing a decoder circuit with stabler action, wherein a discharging MOS transistor 18 is added between the source of the driver MOS transistor 10 and the ground so that the precharge signal $\phi_P$ is inputted at the gate to form a discharge circuit for the node 17.

FIG. 4 is a third embodiment of the present invention wherein the circuit structure is the same as in the second embodiment but it operates with precharge signals $\phi_{P1}$ and $\phi_{P2}$ (which are inputted respectively at the gates of the precharge MOS transistors 2 and 12) which drop at different times as shown in FIG. 5. This means that it is not necessary to use the same signal $\phi_P$ for controlling the precharge MOS transistors 2 and 12, but that different signals may be used as long as they are pulses with overlapping precharge periods.

In any of the three embodiments described above, the positions of the programmable element 14 and the MOS transistor 13 may be interchanged so that the programmable element 14 will be on the side of the ground.

In summary, the decoder circuits of the present invention can eliminate the ill effects caused by the series connection of the programmable element on the word line driving signal and contribute to faster action of MOS memories.

What is claimed is:

1. A decoder circuit for MOS memory, said MOS memory having a redundant structure, comprising
   a word line,
   first MOS transistors for word line selection,
   an output line connected to said first MOS transistors in common,
   a second MOS transistor, the transmissive/non-transmissive condition thereof being controlled by the precharge voltage of said output line to control the transmission of output signals to said word line,
   a third MOS transistor for maintaining voltage, and
   a control circuit including a programmable element which can be in transmissive or non-transmissive condition, said control circuit serving to form an output signal such that said third MOS transistor is maintained in non-transmissive condition if said programmable element is in transmissive condition and that said third MOS transistor is made transmissive if said programmable element is in non-transmissive condition,
   said third MOS transistor having a drain connected to said output line, a source connected to ground potential and a gate connected to said control circuit.

2. The decoder circuit of claim 1 wherein said control circuit further includes a fourth MOS transistor for precharge and a fifth MOS transistor for driving, output of said fourth MOS transistor for precharge being applied to the gate of said fifth MOS transistor serving to control the action of said third MOS transistor for maintaining voltage.

3. The decoder circuit of claim 2 wherein said control circuit further includes a sixth MOS transistor for discharge connected between said fourth MOS transistor and ground potential.

4. The decoder circuit of claim 2 wherein said fourth MOS transistor is coupled to a power source.

* * * * *